United States Patent
Dressel et al.

(10) Patent No.: US 12,027,727 B2
(45) Date of Patent: Jul. 2, 2024

(54) CARRIER STRUCTURE, CELL CONTACTING SYSTEM AND MANUFACTURING METHOD

(71) Applicant: TE Connectivity Germany GmbH, Bensheim (DE)

(72) Inventors: Andre Martin Dressel, Lampertheim (DE); Frank Kaehny, Lautertal (DE); Rudi Blumenschein, Ellwangen (DE); Manuel Eheim, Johannesberg (DE); Jonas Roland Happ, Weingarten (DE); Matthias Beck, Feuchtwangen (DE)

(73) Assignee: TE Connectivity Germany GmbH, Bensheim (DE)

( * ) Notice: Subject to any disclaimer, the term of this patent is extended or adjusted under 35 U.S.C. 154(b) by 782 days.

(21) Appl. No.: 16/909,444

(22) Filed: Jun. 23, 2020

(65) Prior Publication Data
US 2020/0406843 A1 Dec. 31, 2020

(30) Foreign Application Priority Data
Jun. 26, 2019 (DE) .......................... 102019209252.7

(51) Int. Cl.
*H01M 10/42* (2006.01)
*H01M 50/516* (2021.01)
(Continued)

(52) U.S. Cl.
CPC ....... *H01M 50/593* (2021.01); *H01M 50/516* (2021.01); *H01M 50/522* (2021.01);
(Continued)

(58) Field of Classification Search
CPC .......................... H01M 50/593; H01M 10/425
See application file for complete search history.

(56) References Cited

U.S. PATENT DOCUMENTS

| 8,609,276 B2 * | 12/2013 | Han | H01M 50/553 429/170 |
| 9,728,823 B2 | 8/2017 | Fees et al. | |

(Continued)

FOREIGN PATENT DOCUMENTS

| CN | 103563164 A | 2/2014 |
| CN | 204210410 U | 3/2015 |

(Continued)

OTHER PUBLICATIONS

Communication—Extended European Search Report in Appln. No. 20181471.2-1108, dated Oct. 29, 2020, 9 pp.
(Continued)

*Primary Examiner* — Neil Abrams
(74) *Attorney, Agent, or Firm* — Barley Snyder

(57) ABSTRACT

A carrier structure for electrically insulating a first electrically conductive part and a second electrically conductive part includes a base body formed of an electrically insulating material and an electrically insulating spacer embedded in the base body in at least part of a separation region between the first electrically conductive part and the second electrically conductive part. The base body has a first holding structure holding the first electrically conductive part and a second holding structure holding the second electrically conductive part. The electrically insulating spacer has an intumescent material and/or a high temperature-resistant filler.

16 Claims, 6 Drawing Sheets

(51) Int. Cl.
  *H01M 50/522* (2021.01)
  *H01M 50/524* (2021.01)
  *H01M 50/593* (2021.01)
  *H01M 50/211* (2021.01)
  *H01M 50/249* (2021.01)

(52) U.S. Cl.
  CPC ........ *H01M 50/524* (2021.01); *H01M 50/211* (2021.01); *H01M 50/249* (2021.01); *H01M 2220/20* (2013.01)

(56) References Cited

U.S. PATENT DOCUMENTS

| | | |
|---|---|---|
| 9,991,609 B2 | 6/2018 | Hoehn et al. |
| 10,106,710 B2 | 10/2018 | Cyman, Jr. et al. |
| 10,516,143 B2 | 12/2019 | Aldinger et al. |
| 11,011,783 B2 * | 5/2021 | Hermann ............. H01M 50/522 |
| 2012/0229246 A1 | 9/2012 | Depping et al. |
| 2012/0328908 A1 | 12/2012 | Han et al. |
| 2015/0364281 A1 | 12/2015 | Depping et al. |
| 2016/0218401 A1 | 7/2016 | Hermann et al. |
| 2016/0380319 A1 * | 12/2016 | Rhein ................ H01M 50/569 429/90 |
| 2017/0003349 A1 * | 1/2017 | Dawley ............... H01M 50/507 |
| 2017/0141344 A1 | 5/2017 | Jang et al. |
| 2018/0131047 A1 | 5/2018 | Zhao et al. |
| 2018/0287109 A1 | 10/2018 | Nakamoto et al. |
| 2019/0006642 A1 | 1/2019 | Sakaguchi et al. |
| 2020/0280041 A1 * | 9/2020 | Thomas ............. H01M 10/425 |
| 2020/0335737 A1 * | 10/2020 | Hilligoss ........... H01M 50/1245 |
| 2020/0406843 A1 * | 12/2020 | Dressel ............. H01M 50/593 |
| 2023/0058396 A1 * | 2/2023 | Dietz ..................... B32B 9/047 |
| 2023/0253663 A1 * | 8/2023 | Boddakayala ...... H01M 50/298 429/90 |

FOREIGN PATENT DOCUMENTS

| | | |
|---|---|---|
| CN | 105609478 A | 5/2016 |
| CN | 105765008 A | 7/2016 |
| CN | 108352467 A | 7/2018 |
| CN | 207937987 U | 10/2018 |
| CN | 20848394 U | 2/2019 |
| CN | 208478394 U | 2/2019 |
| DE | 3444163 A1 | 6/1986 |
| DE | 3811572 A1 | 10/1989 |
| DE | 4036302 A1 | 5/1992 |
| DE | 29617849 U1 | 1/1997 |
| DE | 102009053145 A1 | 5/2011 |
| DE | 102009019484 B4 | 12/2015 |
| DE | 102014219229 A1 | 3/2016 |
| DE | 102015007408 A1 | 12/2016 |
| DE | 102016100223 A1 | 7/2017 |
| EP | 2372069 B1 | 3/2011 |
| EP | 2538469 A2 | 12/2012 |
| JP | 2144845 A | 6/1990 |
| JP | 2005317459 A | 11/2005 |
| JP | 20113294 A | 1/2011 |
| JP | 2018206605 A | 12/2018 |
| JP | 201933000 A | 2/2019 |
| JP | 2019067581 A | 4/2019 |
| JP | 201996410 A | 6/2019 |
| KR | 101678178 B1 | 11/2016 |
| WO | 2011111676 A1 | 9/2011 |
| WO | 2017159527 A1 | 9/2017 |

OTHER PUBLICATIONS

Chinese First Office Action dated Aug. 11, 2023 with English translation, corresponding to Application No. 202010596221.5, 25 pages.
Chinese First Office Action dated Aug. 11, 2023 with English translation, corresponding to Appiication No. 2020105962215, 25 pages.
Notice of Reasons for Refusal issued by the Japanese Patent Office, and English translation, Patent Application No. 2020-105716, dated Mar. 19, 2024, 15 pages.

* cited by examiner

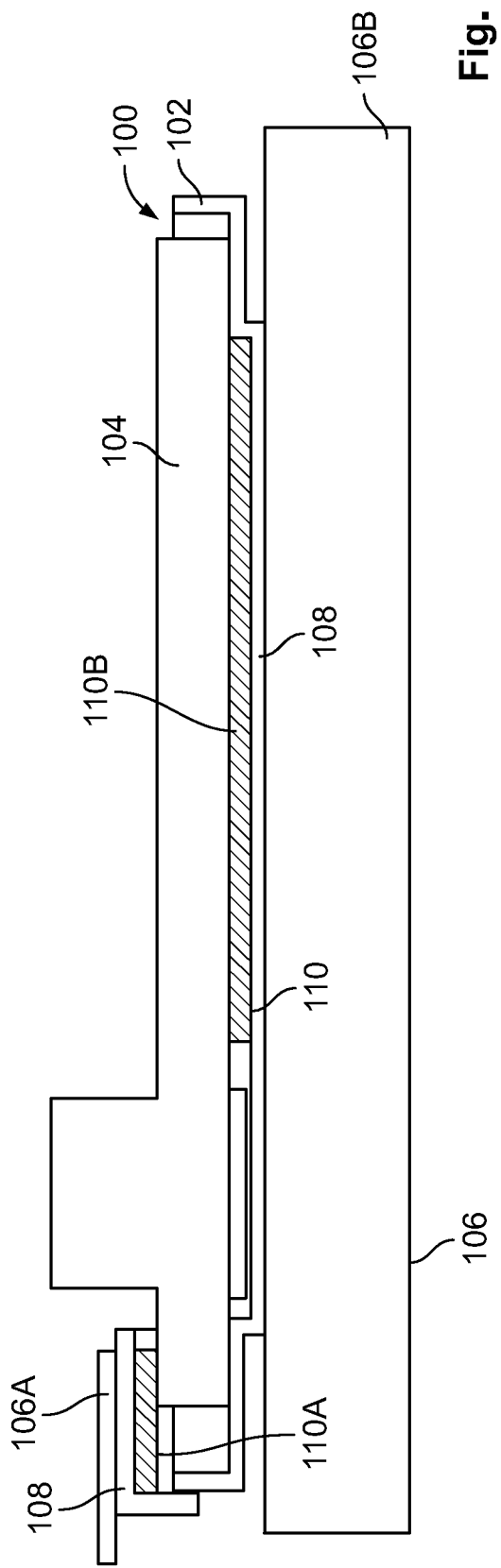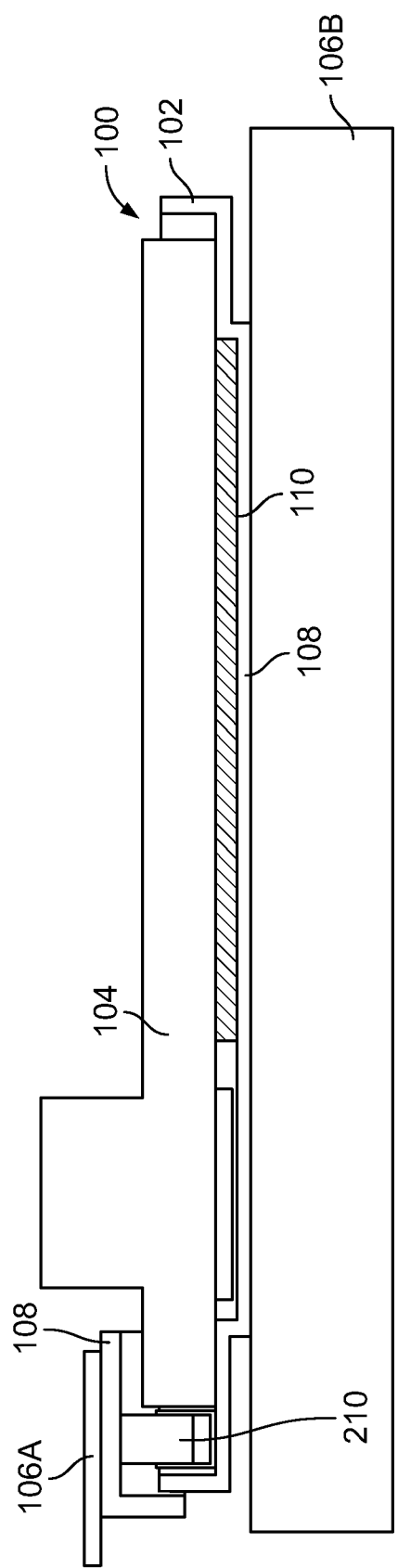

CARRIER STRUCTURE, CELL CONTACTING SYSTEM AND MANUFACTURING METHOD

CROSS-REFERENCE TO RELATED APPLICATION

This application claims the benefit of the filing date under 35 U.S.C. § 119(a)-(d) of German Patent Application No. 102019209252.7, filed on Jun. 26, 2019.

FIELD OF THE INVENTION

The present invention relates to a carrier structure and, more particularly, to a carrier structure that can be used in a contact system of a battery.

BACKGROUND

Electrically conductive busbars which are held on electrically insulating carrier structures are usually used for the electrical contacting of batteries. These carrier structures insulate such a busbar from further electrically conductive elements, such as, for example, other busbars and contacts, metallic attachment and grounding lugs, and also electrically conductive grounding plates.

It has been shown that, in the event of an unusual increase in temperature (e.g. when there is a short circuit), the electrically insulating region which separates the busbar from other electrically conductive components is often not stable enough and fails. The result is an insufficient spacing between the busbar and other electrically conductive components, such that a further short circuit and even a thermal runaway of the entire battery arrangement may occur. Owing to the limited installation space and also owing to the high thermal loads when there is a fault, an increase in the wall thicknesses is often not a viable solution. Moreover, owing to the demands when there is a fault, a comparatively thick insulation made from most plastics would melt, since the melting points of conventional plastics lie in the range from 220° C. to a maximum of 280° C. However, for safe electrical insulation in battery applications, for example, stability up to 500° C. must be guaranteed.

There is therefore a need for carrier structures which insulate safely and reliably between electrically conductive parts even at high temperatures, but which nevertheless are able to be manufactured inexpensively and compactly.

SUMMARY

A carrier structure for electrically insulating a first electrically conductive part and a second electrically conductive part includes a base body formed of an electrically insulating material and an electrically insulating spacer embedded in the base body in at least part of a separation region between the first electrically conductive part and the second electrically conductive part. The base body has a first holding structure holding the first electrically conductive part and a second holding structure holding the second electrically conductive part. The electrically insulating spacer has an intumescent material and/or a high temperature-resistant filler.

BRIEF DESCRIPTION OF THE DRAWINGS

The invention will now be described by way of example with reference to the accompanying Figures, of which:

FIG. 1 is a schematic sectional view of a carrier structure according to an embodiment;

FIG. 2 is a schematic sectional view of a carrier structure according to another embodiment;

DETAILED DESCRIPTION OF THE EMBODIMENT(S)

Figure 3:
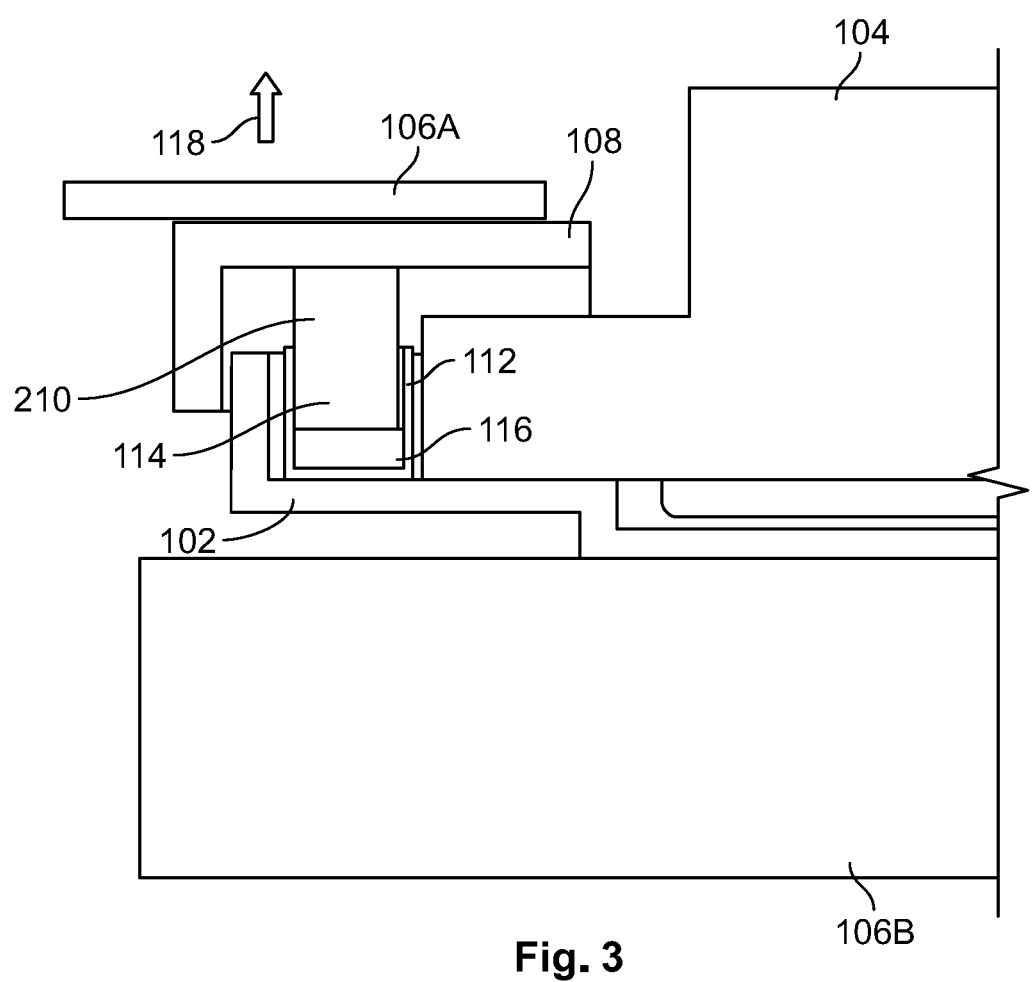
FIG. 3 is a detail of a portion of FIG. 2.

The present invention is explained in greater detail hereafter with reference to the figures, and in particular firstly with reference to the schematic sectional depictions in FIGS. 1 and 2. It is pointed out that, in all the figures, the size ratios and in particular the layer thickness ratios are not necessarily reproduced true to scale. Furthermore, it is obviously clear to a person skilled in the art that the principles according to the invention can be used not only in the context of battery cell contacting systems, but also for other fields of application in which electrically conductive parts insulated from one another by carrier structures are to be separated from one another reliably in the event of overheating.

To better understand the present invention, it is explained in greater detail with the aid of the embodiments depicted in the following figures. In this case, identical parts are indicated with the same reference symbols and the same component names. Furthermore, some features or combinations of features from the different embodiments shown and described may also constitute solutions which are independent, inventive or in accordance with the invention in their own right.

A carrier structure 100 according to an embodiment, shown in FIG. 1, is part of a cell contacting system. Cell contacting systems for lithium-ion batteries comprise cell connectors and a cell holder, into which the connectors are integrated as a robust laser-welded layer construction. Alternatively, the cell connectors can also be attached to the lithium-ion cells by ultrasound welding or electromagnetic pulse welding (EMPT welding). Therefore, so-called "pouch cells" can also be used. The individual battery cells are connected to one another both in series and parallel to one another via the cell connectors. They take care of conduction of current, absorb cell forces, and contain sensors where appropriate. The system, moreover, normally comprises a control interface with thermal and electrical monitoring.

As depicted schematically in FIG. 1, the carrier structure 100 comprises a base body 102, which is manufactured at least partially from an electrically insulating material, e.g. a plastic. A first electrically conductive part 104 is formed, for example, by a voltage-conducting busbar or a battery cell contact. A second electrically conductive part 106 furthermore comprises an electrically conductive welding tab 106A and/or a grounding plate 106B which is in contact with the base body 102 over a larger area. Although two variants of a second electrically conductive part 106 are shown in FIG. 1, of course also only one second electrically conductive part or more than two can be present.

In order to electrically insulate the first electrically conductive part 104 and the second electrically conductive part 106 from one another, the base body 102 has separation regions 108 shown in FIG. 1, which are arranged in an overlapping region between the first electrically conductive part 104 and the second electrically conductive part 106. Experimental investigations on the fire performance have shown, however, that the existing separation regions 108 do not remain sufficiently stable at temperatures above 500° C. to safely prevent an electrical short circuit between the first and second electrically conductive parts 104, 106. The plastic of the separation region 108 frequently burned or softened so significantly that a short circuit occurred.

In order to solve this problem, the present invention provides an additional thermally and electrically insulating spacer 110 in each case in the overlapping regions between the first electrically conductive part 104 and the second electrically conductive part 106, as shown in FIG. 1. According to the invention, the spacers 110A, 110B comprise a high temperature-resistant insulating material or an intumescent material, or alternatively a combination of high temperature-resistant inorganic material and intumescent material, which remains electrically insulating and mechanically and dimensionally stable, or expands, under the action of heat. Glass-like, quartz-like, or ceramic-like fillers, which have a physically heat-resistant and electrically insulating effect, are suitable as high temperature-resistant inorganic insulating materials. Expandable graphite and melamine (2,4,6-triamino-1,3,5-triazine) and its derivatives, for example, are suitable as the intumescent fillers. As is generally known, intumescent materials are understood to be substances which, upon exposure to flames for example, foam up to form a fire-retardant, heat-resistant and electrically insulating foam from organic and/or inorganic material.

According to the invention, an acrylate adhesive which is mixed with the inorganic insulating and/or intumescent material is used as the base material. A commercially available, one-component, solvent-free isocyanate acrylate adhesive, such as can be obtained under the trade name Vitralit® DU 8050 from Panacol-Elosol GmbH, is proven to be a particularly cost-effective embodiment. Adhesives such as this cure under UV irradiation or over longer periods under the influence of moisture.

In order to achieve an even further improved separation between the first electrically conductive part 104 and the second electrically conductive part 106, it can be provided that the cyanoacrylate adhesive of the electrically insulating spacer 110 is mixed with spherical glass particles or glass grains, in particular with gas-filled or vacuum-filled hollow glass beads, which can offer better heat insulation. For example, the mass can contain 60 to 90 percent by volume of glass beads. In the event of fire, the glass beads form a thermal insulation and prevent oxygen from reaching the adhesive enclosed therein. In this way, it can be achieved that the arrangement fulfils, for example, the test provided for authorization in the People's Republic of China, in which safe operation must be maintained for 15 minutes at 500° C.

Without additionally increasing a wall thickness in the overlapping region between the first and second electrically insulating parts 104, 106, it can be ensured that in the event of strong heating, no additional short circuits occur because the carrier material gives way. In the event of a fire, the intumescent material expands, but does not burn up. Furthermore, the intumescent material has the advantage that, in the event of a fault, it closes air gaps, which can provide too low an electrical insulation, and moreover smothers flames as a result of a lack of oxygen.

In an embodiment, the spacer 110 can be embedded as a lateral support element in a lattice structure of the carrier structure 100. In particular, the spacer 110 can be arranged laterally between two busbars of a battery contacting system, so that in the event of overheating, air gaps and creepage paths between the busbars are maintained and filled or even the carrier structure 110 is mechanically stabilised.

Because the intumescent material leads to a relatively strong expansion of the volume of the spacer 110, it may be sufficient for a secure separation of the first and second electrically conductive parts 104, 106 that the intumescent spacer 110 in the non-triggered state takes up less than 50% of the overlapping region or the separation region 108. Thus, only a small amount of space and material is required for the spacer 110.

A carrier structure 100 according to another embodiment is shown in FIGS. 2 and 3. The carrier structure of FIGS. 2 and 3 differs from the arrangement shown in FIG. 1 by way of the differently configured intumescent spacer 210. According to this alternative embodiment, the intumescent spacer 210 has an actuator function, so that in the event of fire not only is the required distance maintained, but rather the spacing between the first electrically conductive part 104 and the second electrically conductive part 106A is even enlarged further.

As shown in FIG. 3, the spacer 210 has a reciprocating piston-like structure. On the base body 102 of the carrier structure 100, a cylinder element 112 is arranged, in which a piston element 114 is located. The piston element 114 is supported on the separation region 108A of the base body 102, and can itself be intumescent or insulating. In the event of overheating, it expands and pushes the separation region 108 in the direction of the arrow 118, such that the spacing between the first electrically conductive part 104 and the second electrically conductive part 106A increases in size. In an embodiment, the cylinder element 112 is a heat-resistant material, such as a ceramic material, and is not electrically conductive.

Alternatively, the piston element 114 itself need not be intumescent, but rather can lie on an intumescent material arranged in a floor region 116 of the cylinder element 112. In this case, the intumescent material in the region 116 pushes the piston element 114 in the direction of the arrow 118, if overheating occurs. In turn, the spacing between the first electrically conductive part 104 and the second electrically conductive part 106A thus increases in size, such that a short circuit between the first electrically conductive part 104 and the second electrically conductive part 106A can be avoided.

Figure 4:
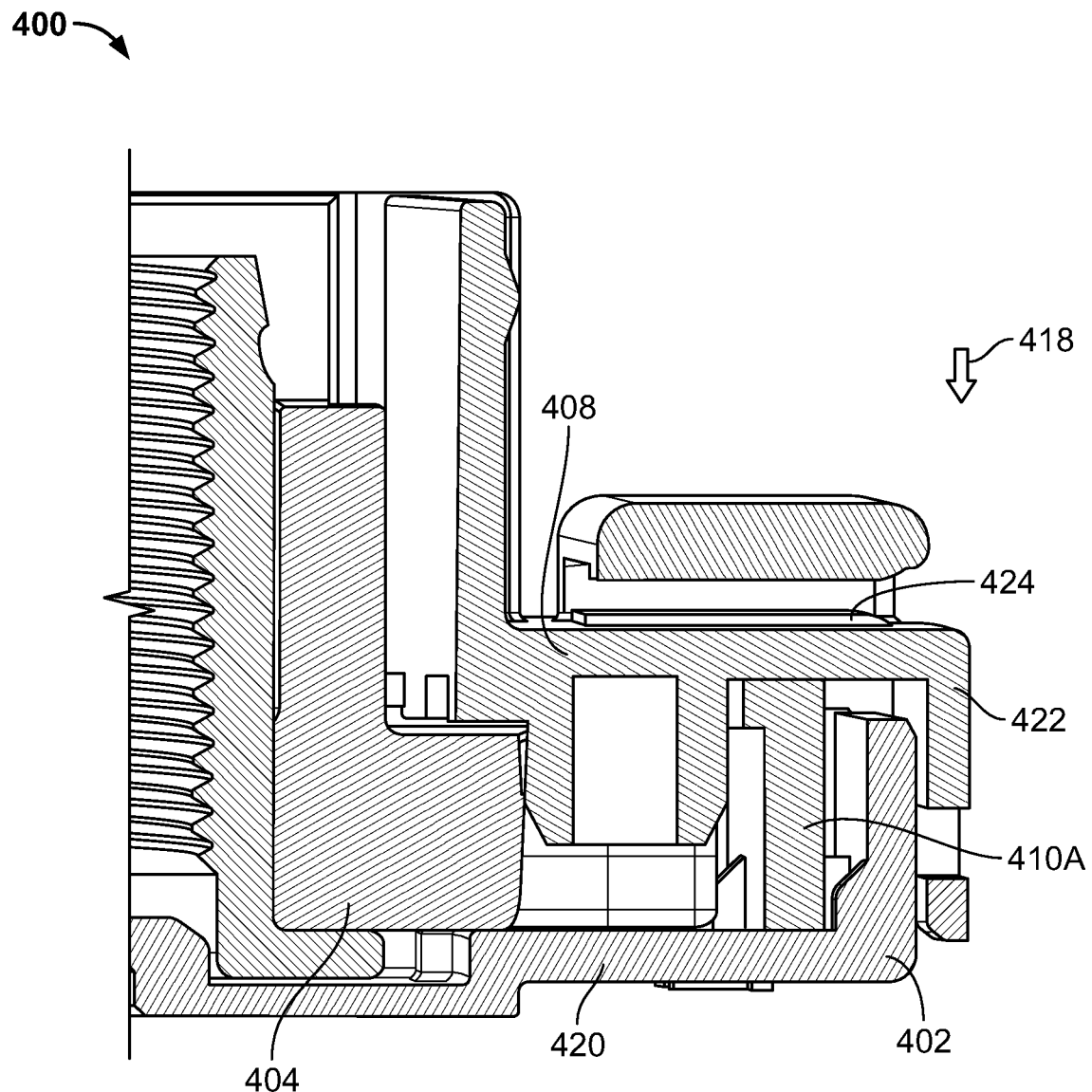
FIG. 4 is a schematic sectional view of a carrier structure according to another embodiment.
Figure 5:
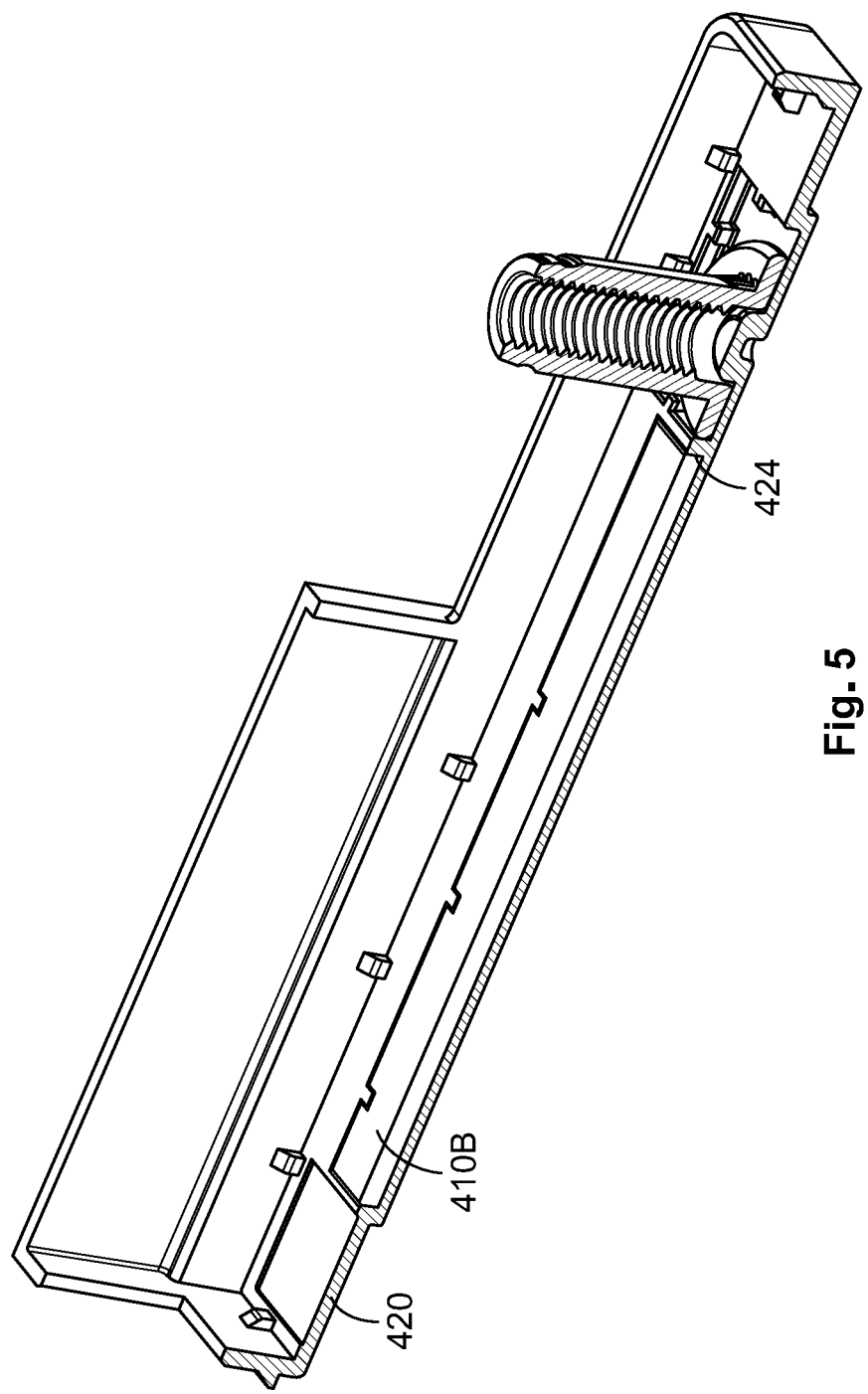
FIG. 5 is a perspective view of a carrier structure according to another embodiment.

A carrier structure 400 according to another embodiment is shown in FIGS. 4 and 5. A base body 402 of the carrier structure 400 has a floor element 420 and a cover element 422. A first electrically conductive part 404, specifically a battery contact here, is seated in the floor element 420. The cover element 422 has a receptacle 424, into which a welding lug, not depicted in this figure, is introduced as the second electrically conductive part. During normal operation, the welding lug and the battery contact 404 are electrically insulated from one another via a separation region 408.

In order to ensure that the welding lug cannot come dangerously close to the battery contact 404 even in the event of overheating and fire, an insulating spacer 410A shown in FIG. 4 is arranged between the floor element 420 and the cover element 422 in such a way that the separation region 408 holds the welding lug in its position if the insulating spacer 410A is loaded with pressure. The direction of the arrow 418 here shows the active direction of the force via the welding lug. The insulating spacer 410A shown in FIG. 4 in this case can also consist of a ceramic material.

As in the above-described embodiments, an acrylate adhesive, which is mixed with the intumescent material, is used as the base material for an intumescent spacer 410A. A commercially available, one-component, solvent-free isocyanate acrylate adhesive, a crosslinked cyanoacrylate adhesive, such as can be obtained under the trade name Vitralit® DU 8050 from Panacol-Elosol GmbH, is proven to be a particularly cost-effective embodiment. In order to achieve an even further improved separation between the first electrically conductive part 104 and the second electrically conductive part 106, it can be provided that the cyanoacrylate adhesive is mixed with spherical glass particles, in particular with gas-filled or vacuum-filled hollow glass beads.

In the embodiment shown in FIGS. 4 and 5, similarly to the arrangements from FIGS. 1 and 2, a further insulating or intumescent spacer 410B can be provided between the battery contact 404 and a second electrically conductive part, not shown here, which bears against the floor element 420. The insulating or intumescent spacer 410B is accommodated in a recess of the floor element 420 and, in the event of fire, stabilizes the distance between the battery contact 404 and the second electrically conductive part, for example a grounding plate. The insulating or intumescent spacer 410B, in an embodiment, is again manufactured from a cyanoacrylate adhesive, which is filled with a glass-like or intumescent substance such as expandable graphite or melamine, such as an anticatalytic melamine or melamine phosphate, or a combination of both. The use of cyanoacrylate adhesive as the base substance for the intumescent spacer in principle also has the advantage that the adhesion to the plastics material of the carrier structure is very good, such that an exceptionally good vibration resistance can be achieved. The second embodiment of the base body 402 as the floor element 420 and cover element 422 has the advantage that the cyanoacrylate adhesive is accessible for a UV curing before the arrangement is completely mounted.

The manufacture of the carrier structure 100, 400 according to the invention will be discussed hereafter in greater detail with reference to the preceding figures.

In a first step, initially the base body 102, 402 is manufactured from a plastic, for example as an injection-molded part. As depicted in FIGS. 4 and 5, the base body is advantageously formed in two parts as a floor element 420 and cover element 422.

Before the floor element 420 and cover element 422 are joined together, a flowable precursor of the insulating or intumescent spacer 110, 410 is introduced into corresponding recesses, with the material being poured in through an injection nozzle, for example. However, in particular, if a glass-bead-filled cyanoacrylate adhesive is used, problems with a lack of flowability can occur when doing this. In order to increase the flowability in the injection nozzle region, the thixotropy of the cyanoacrylate adhesive can be utilised by applying ultrasound energy at this location.

The material poured into the recesses is subsequently cured by means of UV radiation or ultrasound energy. Only then are the electrically conductive parts mounted and the entire arrangement assembled.

Figure 6:
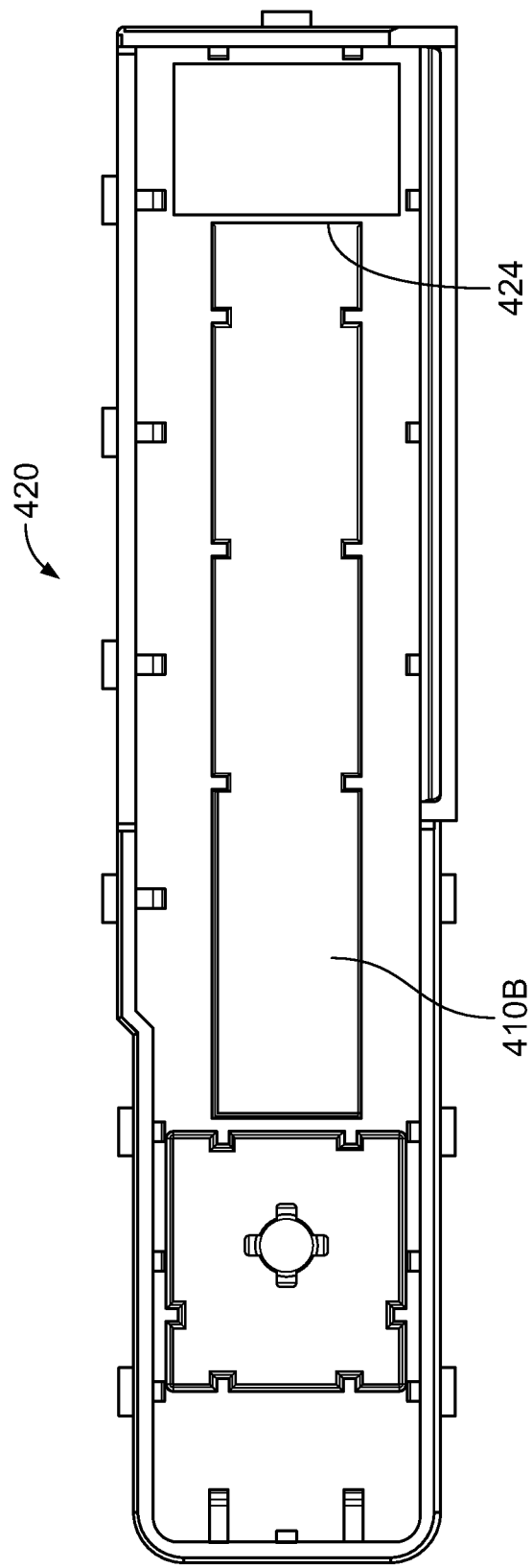
FIG. 6 is a plan view of the carrier structure of FIG. 5.

FIG. 6 shows a schematic plan view of the floor element 420 from FIG. 5. The electrically insulating spacer 410B is held in a corresponding flat receptacle 424 in the floor element 420. Although, in the preceding description, a method was described in which the electrically insulating spacer 410B is introduced in the form of a flowable precursor into the receptacle 424 and subsequently cured, the spacer 410B can also be inserted as a prefabricated part into the receptacle 424 and held by a press-fit, for example.

Figure 7:
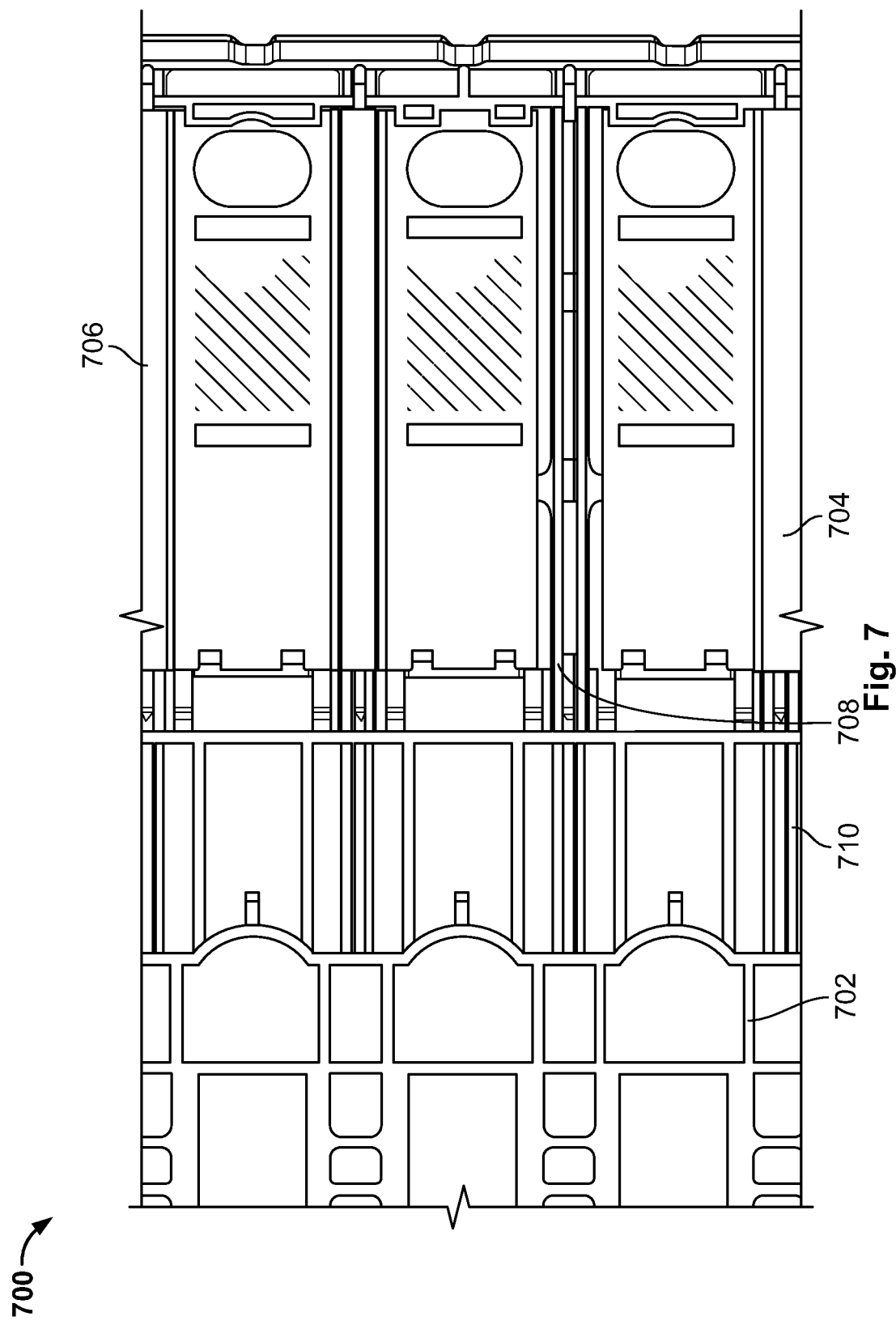
FIG. 7 is a plan view of a cell contacting system according to an embodiment.

FIG. 7 shows a detail of a cell contacting system 700 for a motor vehicle battery, such as hybrid or electric vehicles, as a further possible application of the electrically insulating spacer according to the invention. The cell contacting system 700 has an electrically insulating base body which is configured as a frame 702. A first electrically conductive part 704 and a second electrically conductive part 706, e.g. two busbars, are fitted on this frame next to one another in one plane. In order to prevent short circuits from being formed between the first electrically conductive part 704 and the second electrically conductive part 706 in the event of overheating, according to the invention an electrically insulating spacer 710 is provided laterally. According to the invention, the electrically insulating spacer 710 is provided with an intumescent material and/or with an inorganic high heat-resistant material. In this way, in the event of overheating, the separation region 708 can be supported reliably and the necessary electrical insulation is preserved. In particular, in the case of an intumescent filler, air gaps and creepage paths between the busbars are held and filled.

The cell contacting system 700 has a carrier structure 100, 400 and a first plurality of separately formed contact elements for contacting in each case two neighboring battery cells of the motor vehicle battery module, wherein the contact elements are arranged next to one another in a first row and in each case are attached to one side of the carrier structure 100, 400, furthermore comprising a second plurality of separately formed contact elements, which are arranged next to one another in a second row and which are provided on a side of the carrier structure opposite the first row, so that contact elements for contacting in each case two neighbouring battery cells of the motor vehicle battery module are positioned on both sides of the carrier structure 100, 400.

What is claimed is:

1. A carrier structure for electrically insulating a first electrically conductive part and a second electrically conductive part, comprising:
    a base body formed of an electrically insulating material, the base body having a first holding structure holding the first electrically conductive part and a second holding structure holding the second electrically conductive part; and
    an electrically insulating spacer embedded in the base body in at least part of a separation region between the first electrically conductive part and the second electrically conductive part, the electrically insulating spacer has an intumescent material and/or a high temperature-resistant filler.

2. The carrier structure of claim 1, wherein the electrically insulating spacer has a crosslinked cyanoacrylate adhesive.

3. The carrier structure of claim 1, wherein the electrically insulating spacer has a piston element formed of an at least partially intumescent material and a cylinder element formed of a heat-resistant material, the piston element expands inside the cylinder element under heat.

4. The carrier structure of claim 1, wherein the electrically insulating spacer has glass, quartz and/or ceramic as the high temperature-resistant filler.

5. The carrier structure of claim 4, wherein the electrically insulating spacer has a plurality of hollow glass beads as the high temperature-resistant filler.

6. The carrier structure of claim 1, wherein the electrically insulating spacer is embedded as a lateral support element in a lattice structure of the carrier structure.

7. The carrier structure of claim 1, wherein the electrically insulating spacer takes up less than 50% of the separation region.

8. The carrier structure of claim 1, wherein the electrically insulating spacer enlarges a spacing between the first electrically conductive part and the second electrically conductive part under heat.

9. The carrier structure of claim 1, wherein the first electrically conductive part is a voltage-conducting bar of a battery arrangement, and/or the second electrically conductive part is a welding lug or a grounding plate.

10. A cell contacting system of a motor vehicle battery module, comprising:
   a carrier structure including:
      a base body formed of an electrically insulating material, the base body having a first holding structure holding a first electrically conductive part and a second holding structure holding a second electrically conductive part; and
      an electrically insulating spacer embedded in the base body in at least part of a separation region between the first electrically conductive part and the second electrically conductive part, the electrically insulating spacer has an intumescent material and/or a high temperature-resistant filler;
   a first plurality of separately formed contact elements for contacting in each case a pair of neighboring battery cells of the motor vehicle battery module, the contact elements are arranged next to one another in a first row and are attached to a side of the carrier structure; and
   a second plurality of separately formed contact elements arranged next to one another in a second row and provided on a side of the carrier structure opposite the first row, the contact elements for contacting a pair of neighbouring battery cells of the motor vehicle battery module are positioned on both sides of the carrier structure.

11. A method for manufacturing a carrier structure, comprising:
   providing a base body; and
   introducing an electrically insulating spacer into a recess of the base body, the electrically insulating spacer has an intumescent material and/or an inorganic high temperature-resistant filler.

12. The method of claim 11, wherein the electrically insulating spacer is introduced as a flowable precursor and subsequently the flowable precursor of the electrically insulating spacer is cured.

13. The method of claim 12, wherein the step of curing the flowable precursor comprises the introduction of UV radiation or ultrasound energy.

14. The method of claim 12, wherein the flowable precursor has an acrylate-based one-component adhesive.

15. The method of claim 13, wherein the electrically insulating spacer has an expansion substance selected from the group including expandable graphite, melamine or mixtures thereof.

16. The method of claim 13, wherein the electrically insulating spacer has a filler selected from the group including quartz, glass grains, glass beads, and hollow glass beads or mixtures thereof.

* * * * *